United States Patent [19]
Tanaka

[11] Patent Number: 6,028,791
[45] Date of Patent: Feb. 22, 2000

[54] SEMICONDUCTOR MEMORY DEVICE WITH IMPROVED DATA READING SPEED

[75] Inventor: Tomoharu Tanaka, Yokohama, Japan

[73] Assignee: Kabushiki Kaisha Toshiba, Kawasaki, Japan

[21] Appl. No.: 09/143,350

[22] Filed: Aug. 28, 1998

[30] Foreign Application Priority Data

Sep. 2, 1997 [JP] Japan .................................. 9-237031

[51] Int. Cl.[7] .............................. G11C 16/06; G11C 7/02
[52] U.S. Cl. ................ 365/185.21; 365/210; 365/185.2; 365/208
[58] Field of Search .................................. 365/207, 208, 365/210, 185.2, 185.21

[56] References Cited

U.S. PATENT DOCUMENTS

| | | | |
|---|---|---|---|
| 5,258,958 | 11/1993 | Iwahashi et al. | ........................ 365/210 |
| 5,289,415 | 2/1994 | DiMarco et al. | ........................ 365/208 |
| 5,301,149 | 4/1994 | Jinbo | ........................ 365/208 |
| 5,321,659 | 6/1994 | Taguchi | ........................ 365/207 |
| 5,675,535 | 10/1997 | Jinbo | ........................ 365/185.2 |
| 5,773,997 | 6/1998 | Stiegler | ........................ 327/53 |

*Primary Examiner*—Son Mai
*Attorney, Agent, or Firm*—Banner & Witcoff, Ltd.

[57] ABSTRACT

A semiconductor memory device, arranged to increase the data reading speed, includes a memory cell array having memory cells connected to bit lines and a sense amplifier placed adjacent to the memory cell array for detecting stored data in the memory cells. A bit line control circuit controls writing into the memory cells. A data input/output buffer outputs detected data by the sense amplifier and applies externally applied input write data to the bit line control circuit.

20 Claims, 12 Drawing Sheets

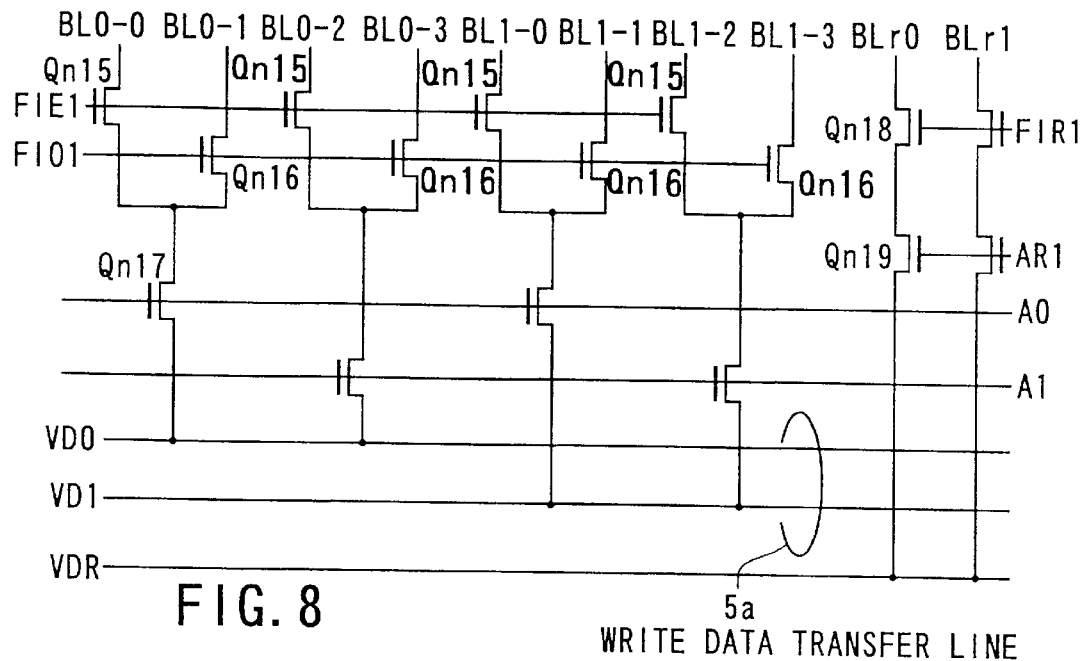
FIG. 8  5a WRITE DATA TRANSFER LINE
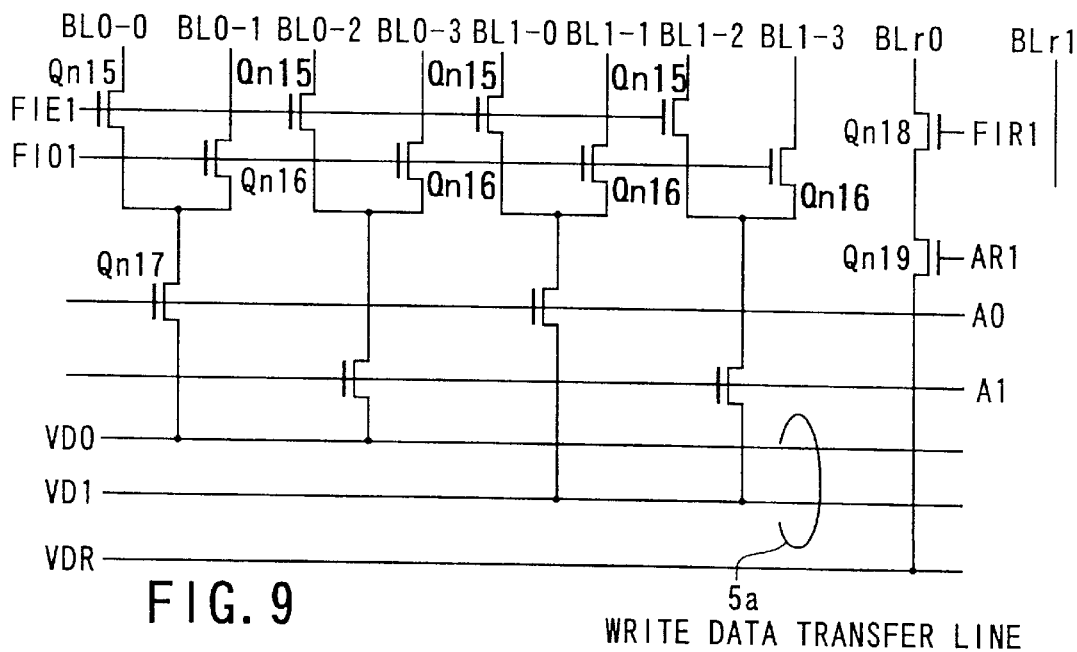
FIG. 9  5a WRITE DATA TRANSFER LINE

TO SENSE AMPLIFIER 17

SEMICONDUCTOR MEMORY DEVICE WITH IMPROVED DATA READING SPEED

BACKGROUND OF THE INVENTION

The present invention relates to a semiconductor memory device, such as a flash memory, EEPROM, EPROM, PROM, ROM, or SRAM, which is arranged to improve a sense circuit that senses the potentials on bit lines and reduce parasitic capacitances associated with the bit lines to thereby allow fast data readout.

An example of a memory cell used in flash memories has an n-channel type of MOSFET cell used in flash memories has an n-channel type of MOSFET structure in which a charge storage layer (floating gate) and a control gate are stacked above a p-type semiconductor substrate.

Such a memory cell usually stores a bit of data, either "0" or "1", depending on the amount of charge stored on its floating gate. The stored data can be read out by applying a read voltage to the control gate and detecting the magnitude of resulting current flowing through the memory cell (hereinafter referred to as readout cell current).

For example, assume that positive charges are stored on the floating gate and the threshold voltage is set to less than 2 V. Then, a readout cell current is produced when a read voltage of 3 V is applied to the control gate, so that data "1" is read out. When negative charges are stored on the floating gate and the threshold voltage is more than 4 V, no cell current will be produced even if a read voltage of 3 V is applied to the control gate. In this case, read data is "0".

A number of memory cells are arranged in the form of a matrix to form a memory cell array. To read data out of a memory cell selected by an address signal, a sense amplifier is used as a sense circuit. To make a connection between a selected memory cell and the sense amplifier, a transmission gate is provided which is switched on or off by an address signal.

FIG. 1 shows in block diagram form a conventional flash memory.

A memory cell array is divided into two blocks 1-1 and 1-2. To apply a voltage at a predetermined level to a selected bit line (not shown), bit line select circuits 2-1 and 2-2 are disposed adjacent to the memory cell array blocks 1-1 and 1-2, respectively. A column address buffer 3 is provided which applies a column address signal to the bit line select circuits 2-1 and 2-2 to select a bit line in each memory cell array block.

The column address buffer 3 is arranged to output that column address signal in response to a block address signal indicating which memory cell array block to select. The block address signal is outputted from a block address buffer 4.

Data in a memory cell connected to a selected bit line is transferred over the bit line and a data transfer line 5 to a bit line control circuit 6 having a sense amplifier. The transferred cell data is amplified by the sense amplifier, buffered in a data input/output buffer 7, and outputted from a data input/output terminal 8 to the outside of the memory chip.

To-be-written input data applied to the data input/output terminal 8 is sent to the bit line control circuit 6 through the data input/output buffer 7. The bit line control circuit 6 outputs a bit line voltage corresponding to the input data onto the data transfer line 5, applying an input data-dependent voltage to a bit line selected by the bit line select circuit 2-1 or 2-2.

In each memory cell array block, though not shown, a plurality of word lines (for example, two word lines) forms one sector. To apply a voltage at a predetermined level to a selected sector of word lines, word line voltage transfer circuits 9-1 and 9-2 are disposed adjacent to the memory cell array blocks 1-1 and 1-2, respectively.

To select sectors having a sector address common to both the blocks, a sector select circuit 10 is provided in common to the blocks. A sector address signal is produced by a row address buffer 11 and applied to the sector select circuit 10. To select one word line from a sector selected by the sector select circuit 10, word line select circuits 12-1 and 12-2 are provided for the word line voltage transfer circuits 9-1 and 9-2, respectively.

The word line select circuits 12-1 and 12-2 receive a row address signal from the row address buffer 11 and a block address signal from the block address buffer 4. A voltage outputted from the word line select circuit 12-1 or 12-2 for a selected block is transferred to a selected sector via the corresponding word line voltage transfer circuit 9-1 or 9-2. The word line voltage control in the selected sector allows a word line to be selected from that sector. In addition, to select a source line in a selected block, source line select circuits 13-1 and 13-2 are provided each of which is also connected to receive a block address signal.

A voltage from the source line select circuit 13-1 or 13-2 for a selected block is sent to a selected sector. The source line voltage control in the selected sector allows a source line in that sector to be selected.

The row address buffer 11 is responsive to an address signal inputted from address signal input terminals 14 to provide a sector address signal and a row address signal. The column address buffer 3 and the block address buffer 4 are also connected to receive the address signal from the address signal input terminals to provide a block address signal and a column address signal.

The memory cell arrays 1-1 and 1-2, bit line select circuits 2-1 and 2-2, sector select circuit 10, word line voltage transfer circuits 9-1 and 9-2, select circuits 12-1 and 12-2, source line select circuits 13-1 and 13-2, row address buffer 11, block address buffer 4, bit line control circuit 6, data input/output buffer 7 and column address buffer 3 are each controlled by a control signal/control voltage generator 16, which is responsive to a control signal from a control signal input terminal 15 to provide control signals and control voltages.

In the memory thus arranged, at the time of a read operation data in a memory cell is transferred to the bit line control circuit 6 over a bit line and the data transfer line 5. The signal read from the memory cell is very small in magnitude. The fast detecting of this signal allows the reading speed to be increased. The capacitances associated with the bit lines are substantially equal to the capacitance associated with the data transfer line 5 or the latter may be larger than the former. If, therefore, the sense amplifier in the bit line control circuit 6 is placed in the vicinity of the bit lines, then the reading speed will be increased. In addition, if the sense amplifier, which is provided in common to many bit lines, is provided for each group of a smaller number of bit lines, the parasitic capacitance associated with each sense amplifier will be further reduced, allowing fast readout of data.

However, an increase in the number of sense amplifiers will result in an increase in the chip size. Therefore, it is desirable that each sense amplifier be of small dimensions and arranged to detect bit line signals with accuracy.

The sense amplifier in the bit line control circuit is heretofore placed apart from the memory cell array, requiring a relatively long data transfer line between the memory cell array and the sense amplifier. Thus, static capacitances associated with the transmission gates and the data transfer line become increased. With low readout cell currents, it takes long to read data.

The gate electrodes of memory cells arranged in the direction of a row form a word line. The longer the word line, the longer it takes to charge the word line up to a read voltage. This is a cause of long readout time.

Most of memory devices use a current mirror type of differential amplifier as a sense amplifier. This differential amplifier compares a readout cell current with a reference current to read data. Variations in operating characteristics between transistors forming the differential amplifier might cause a detection error in the magnitude relation between currents. To avoid this, it is required to make the difference between the cell current and the reference current large. However, an attempt to increase the readout cell current requires a quantity of charge to be stored on the cell floating gate to be increased, which increases the time taken to write into and erase the memory cell.

As described above, a conventional semiconductor memory device, such as a flash memory, has a problem that large stray capacitances associated with the bit lines result in an increase in the time taken to read data.

In addition, there is a problem that signal delays associated with the word lines result in an increase in the time taken to read data. Due to variations in operating characteristics among transistors constituting a sense amplifier in particular, readout cell currents have to be increased.

BRIEF SUMMARY OF THE INVENTION

It is an object of the present invention to provide a semiconductor memory device which suppresses parasitic capacitances associated with bit lines and avoids variations in operating characteristics between transistors constituting a sense amplifier, thereby allowing fast data readout.

According to an aspect of the present invention, there is provided a semiconductor memory device comprising:

a memory cell transistor;

a bit line connected to one end of the memory cell transistor;

a word line connected to a gate of the memory cell transistor;

a reference cell transistor;

a reference bit line connected to one end of the reference cell transistor;

a reference word line connected to a gate of the reference cell transistor;

a sense circuit for sensing data stored in the memory cell transistor, the sense circuit including a first MIS transistor of a first conductivity type having its one end connected to a first sense output node, its other end connected to a first potential, and its gate coupled to the one end of the memory cell transistor, a second MIS transistor of the first conductivity type having its one end connected to a second sense output node, its other end connected to the first potential, and its gate coupled to the one end of the reference cell transistor, a third MIS transistor of a second conductivity type having its one end connected to the first sense output node, its other end connected to a second potential, and its gate coupled to the first sense output node, a fourth MIS transistor of the second conductivity type having its one end connected to the second sense output node, its other end connected to the second potential, and its gate connected to the first sense output node, and a fifth MIS transistor of the first conductivity type connected between the second sense output node and the gate of the second MIS transistor; and a data readout control circuit for controlling the fifth MIS transistor to conduct for a predetermined interval of time.

According to another aspect of the present invention, there is provided a semiconductor memory device comprising:

a memory cell transistor;

a bit line connected to one end of the memory cell transistor;

a word line connected to a gate of the memory cell transistor;

a reference cell transistor;

a reference bit line connected to one end of the reference cell transistor;

a reference word line connected to a gate of the reference cell transistor;

a sense circuit for sensing data stored in the memory cell transistor, the sense circuit including a first MIS transistor of a first conductivity type having its one end connected to a first sense output node, its other end connected to a first potential, and its gate coupled to the one end of the memory cell transistor, a second MIS transistor of the first conductivity type having its one end connected to a second sense output node, its other end connected to the first potential, and its gate coupled to the one end of the reference cell transistor, a third MIS transistor of a second conductivity type having its one end connected to the first sense output node, its other end connected to a second potential, and its gate coupled to the second sense output node, a fourth MIS transistor of the second conductivity type having its one end connected to the second sense output node, its other end connected to the second potential, and its gate connected to the second sense output node, and a fifth MIS transistor of the first conductivity type connected between the first sense output node and the gate of the first MIS transistor; and a data readout control circuit for controlling the fifth MIS transistor to conduct for a predetermined interval of time.

According to still another aspect of the present invention, there is provided a semiconductor device comprising:

a memory cell array having memory cells;

a reference memory cell;

a sense amplifier placed adjacent to the memory cell array for sensing data stored in the memory cells, the sense amplifier having a first current mirror circuit of a first conductivity type connected to a supply node of a first signal to supply the first signal corresponding to stored data in the memory cells, a second current mirror circuit of the first conductivity type connected to a supply node of a second signal to supply the second signal corresponding to stored data in the reference memory cell, a third current mirror circuit of a second conductivity type responsive to outputs of the first and second current mirror circuits for outputting complementary data, and a switch for substantially shorting the supply node of the first signal to the supply node of the second signal through the third current mirror circuit;

a data writing control circuit for controlling writing into the memory cells; and a data input/output circuit for outputting data sensed by the sense amplifier and supplying externally applied data to the data writing control circuit.

Thus, the semiconductor memory device of the present invention suppresses parasitic capacitances associated with the bit lines by placing multiple sense amplifiers in the neighborhood of the bit lines, reduces the circuit area by allowing the sense amplifiers to share their circuit portion, absorbing variations in operating characteristics among transistors constituting the sense amplifiers by equalizing the sense nodes and the reference nodes through the sense amplifiers, and makes the time taken for the word line to charge up to a read voltage invisible by supplying the word line with the read voltage simultaneously with the equalization, thus allowing fast data readout.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 8 shows a circuit arrangement of the bit line select circuits in the flash memory of FIG. 2;

FIG. 9 shows the other circuit arrangement of the bit line select circuits in the flash memory of FIG. 2;

DETAILED DESCRIPTION OF THE INVENTION

Figure 2:
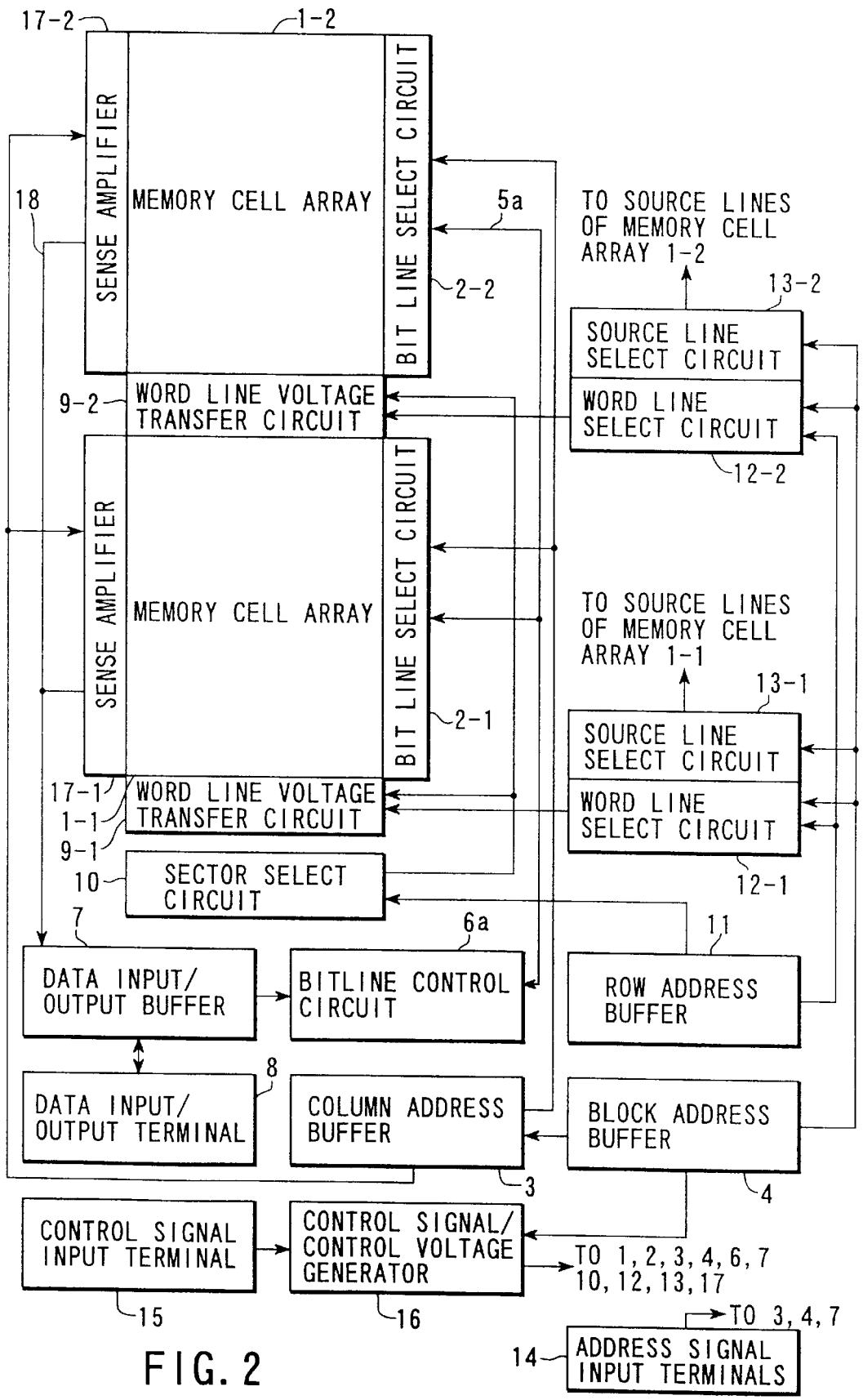
FIG. 2 is a block diagram of a flash memory according to an embodiment of a semiconductor memory device of the present invention.

Referring now to FIG. 2 there is illustrated, in block diagram form, a flash memory embodying the present invention.

Figure 1:
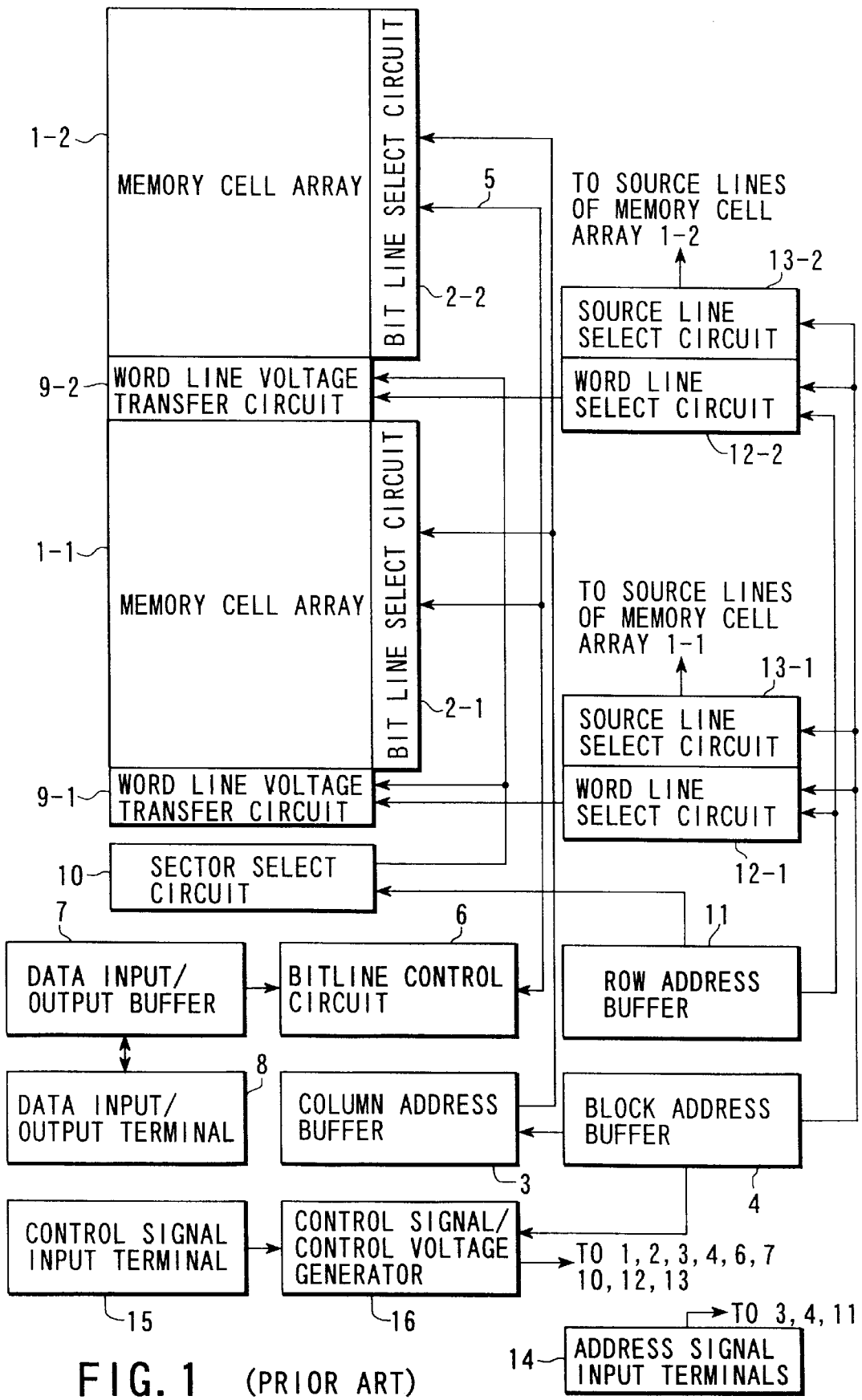
FIG. 1 is a block diagram of a conventional semiconductor memory device.

The flash memory shown in FIG. 2 differs in parts from the conventional memory of FIG. 1; thus, only those parts will be described hereinafter.

To-be-written input data applied to a data input/output terminal 8 is sent to a bit line control circuit 6a via a data input/output buffer 7. The bit line control circuit 6a outputs a bit line voltage corresponding to the input data over a data transfer line 5a.

The bit line voltage applied to bit line select circuits 2-1 and 2-2 over the data transfer line 5a is applied to a selected bit line (not shown) in each block. Note that, in this case, the bit line control circuit 6a is a circuit only for writing data and performs no read operation. Instead, sense amplifiers 17-1 and 17-2 are placed adjacent to memory cell array blocks 1-1 and 1-2, respectively.

Read data detected by the sense amplifiers 17-1 or 17-2 is sent to the data input/output buffer 7 over a data transfer line 8 and then outputted to the outside of the memory chip through the data input/output terminal 8. To the sense amplifiers 17-1 or 17-2 are applied a column address signal from a column address buffer 3 and a control signal from a control signal/control voltage generator 16.

Each of the sense amplifiers 17-1 and 17-2 detects data stored in a memory cell associated with a selected bit line. The control signal/control voltage generator 16 receives a block address signal from a block address buffer 4.

Figure 3:
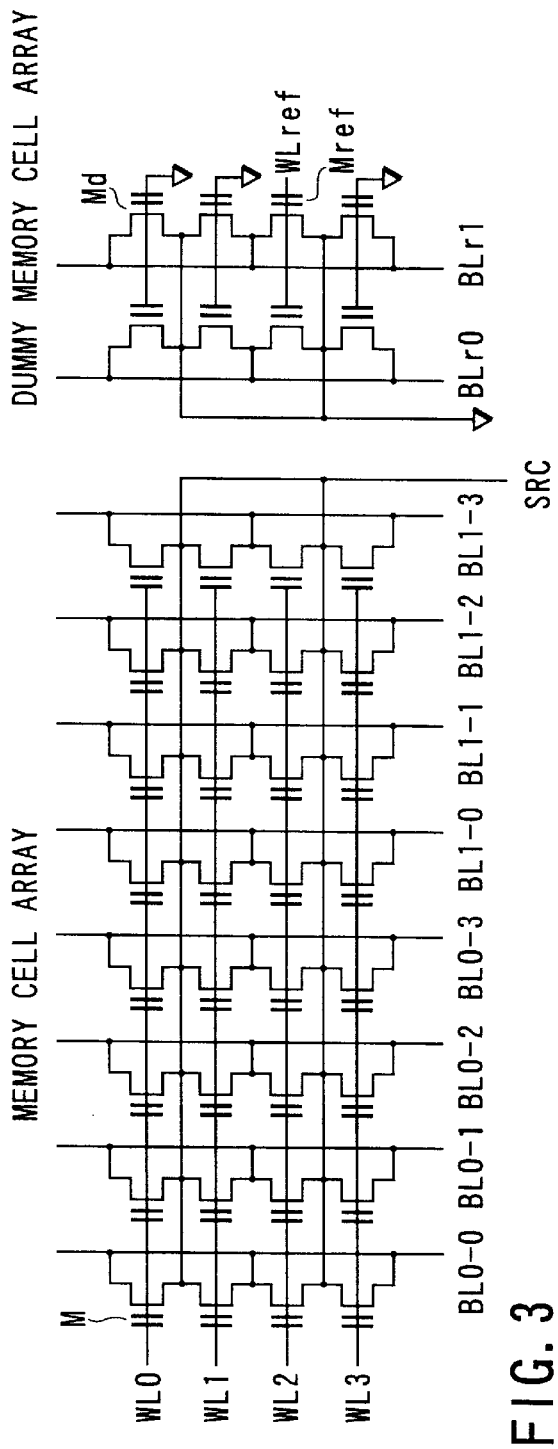
FIG. 3 is a circuit diagram of the memory cell arrays in the flash memory of FIG. 2.

FIG. 3 shows a specific circuit arrangement of each of the memory cell array blocks 1-1 and 1-2 in the flash memory of FIG. 2.

Although the arrangement of the memory cell array block 1-1 is illustrated here, the other array block 1-2 is arranged identically.

In this block, a number of memory cells M are arranged in rows and columns. Each memory cell has a drain, a source, a floating gate, and a control gate. The control gates of the memory cells arranged in the same row are connected together by a word line. In this example shown, the gate electrodes of the respective memory cells M arranged in each of first to fourth rows are associated with a respective one of word lines WL0 to WL3.

The drains of the memory cells arranged in the same column are connected together by a bit line. In this example, the drains of the respective memory cells M arranged in each of first to eighth columns are connected with a respective one of bit lines BL0-0 to BL0-3 and BL1-0 to BL1-3.

Although, in this example, the memory cell block has 4×8 memory cells, it may have 1024×4096 memory cells. The sources of all the memory cells M are connected together to a source line SRC.

Adjacent to each memory cell array is provided a dummy memory cell array, which is composed of reference memory cells Mref and dummy memory cells Md.

The reference memory cells Mref generate a reference potential used in detecting stored data in the memory cells M. The dummy memory cells are provided only for the purpose of filling up locations in the dummy memory cell array where no reference memory cells are provided. The control gate electrodes of the respective dummy memory cells Md are connected to ground. The control gate electrodes of the respective reference memory cells Mref are connected to a reference word line WLref. The dummy memory cells Md and the reference memory cells Mref each have their respective drain connected to a reference bit line BLr0 or BLr1.

The bit lines BL and the reference bit lines BLr are made about equal to one another in geometry, static capacitance, and resistance. The sources of the dummy memory cells Md and the reference memory cells Mref are all connected to ground.

The word lines WL in the memory cell array blocks 1-1 and 1-2 are connected to the word line voltage transfer circuits 9-1 and 9-2, respectively. The bit lines BL and the reference bit lines BLr in the memory cell arrays 1-1 and 1-2 are connected to the bit line select circuits 2-1 and 2-2, respectively. In addition, the bit lines BL and the reference bit lines BLr in the memory cell arrays 1-1 and 1-2 are also connected to the sense amplifiers 17-1 and 17-2, respectively. The source lines SRC in the memory cell arrays 1-1 and 1-2 are connected to the source line select circuits 13-1 and 13-2, respectively.

The reference word line WLref in the dummy memory cell adjacent to a selected one of the memory cell arrays 1-1 and 1-2 is supplied with a control signal produced by the control signal/control voltage generator 16.

Figure 4:
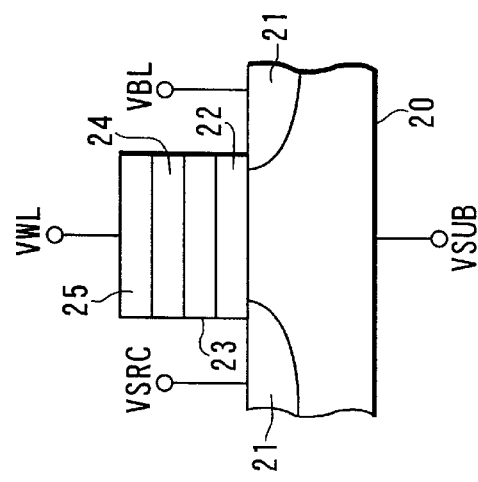
FIG. 4 illustrates, in a sectional view, the structure of a memory cell in the flash memory cell arrays of FIG. 2.

FIG. 4 shows the structure in section of the memory cell M. N-type source/drain diffusions 21 are formed in the surface of a P-type semiconductor substrate 20. An insulating film 22 is formed on the channel region between the source and the drain, and a floating gate electrode 23 is formed on the insulating film. On the floating gate electrode, an insulating film 24 and a control gate electrode 25 are stacked in this order. In order to control the neutral threshold (the threshold in the initial state where no charge is stored on the floating gate electrode), appropriate impurities are introduced into the channel region as required.

In FIG. 4, VSUB, VBL, VSRC and VWL denote signal voltages which are applied to the substrate 20, the bit line BL (drain), the source line SRC (source), and the word line WL (control gate electrode), respectively.

For example, by driving the source line (VSRC) to 12 volts, the substrate (VSUB) to 0 volts (ground), the bit line BL (VBL) into the floating state, and the word line (VWL) to 0 volts, data erasing is performed. This data erasing causes the potential on the floating gate electrode 23 to be shifted in the positive direction, lowering the memory cell threshold. The erased state remains unchanged from the state where "1" is stored. By driving the source line to 0 volts, the substrate to 0 volts, the bit line to 6 volts, and the word line to 12 volts, the memory cell is written with "0". This write operation causes the potential on the floating gate 23 to be shifted in the negative direction, raising the memory cell threshold.

The sectional structure of the dummy memory cells Md and the reference memory cells Mref shown in FIG. 3 remains unchanged from that of the memory cells M shown in FIG. 4. Under certain conditions, however, their dimensions, such as channel length and channel width, may be altered. In addition, the amount of impurity to be introduced into their channel region may be varied.

Figure 5:
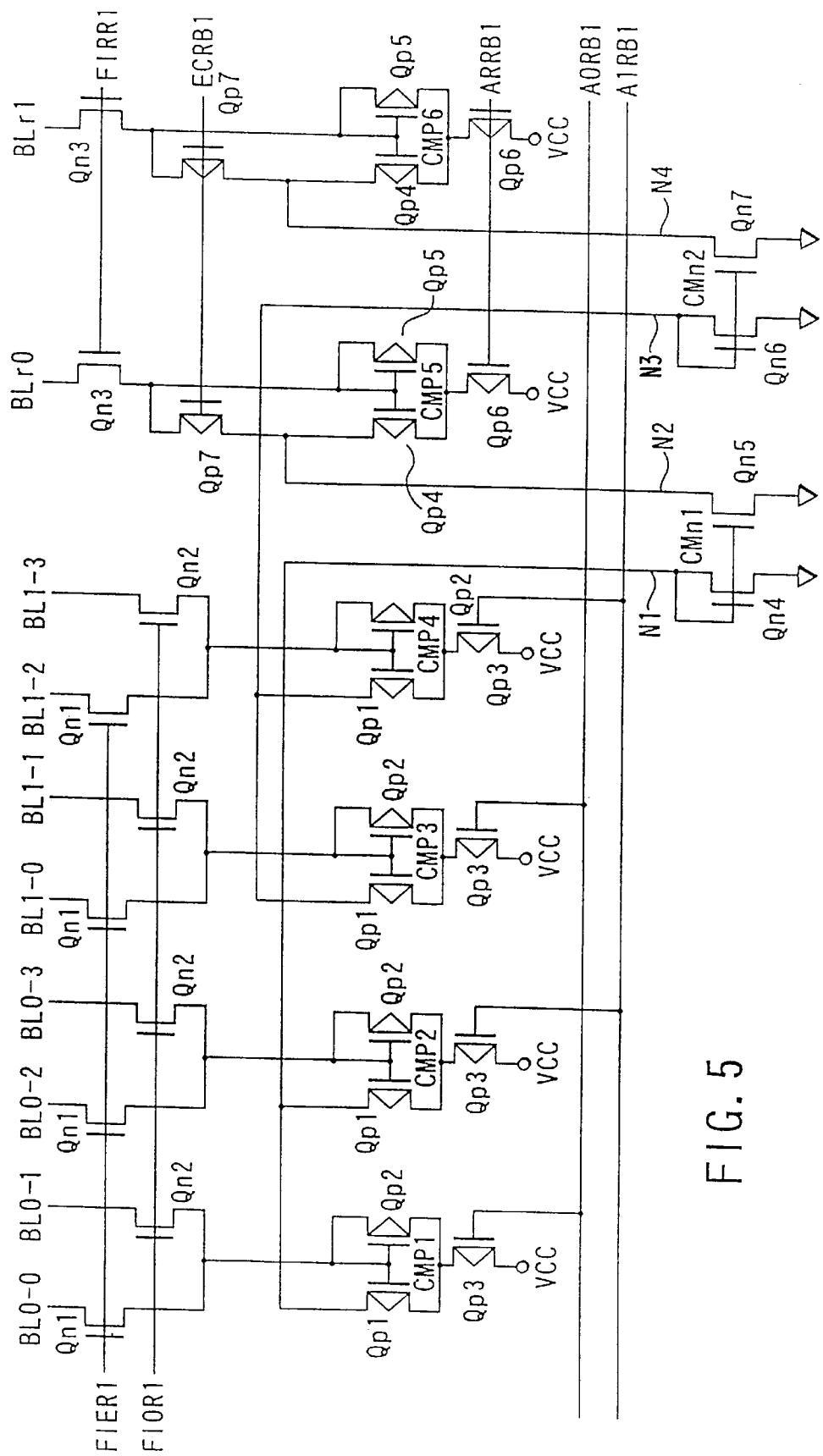
FIG. 5 shows a circuit arrangement of the sense amplifiers of FIG. 2.

FIG. 5 shows a specific circuit arrangement of the sense amplifiers 17-1 and 17-2 in the flash memory shown in FIG. 2. Although the circuit arrangement of the sense amplifier 17-1 is illustrated herein, the other sense amplifier 17-2 is also arranged identically.

In this example, in order to permit potentials on two bit lines to be sensed at the same time, two sets of sense amplifiers are provided as a sense circuit.

Of the eight bit lines BL0-0 to BL0-3 and BL1-0 to BL1-3, paired bit lines, BL0-0 and BL0-1, BL0-2 and BL0-3, BL1-0 and BL1-1, BL1-2 and BL1-3, are connected to the sources of two n-channel MOS transistors Qn1 and Qn2, respectively.

A column address signal FIER1 is applied to the gate electrodes of the respective MOS transistors Qn1. A column address signal FIOR1 is applied to the gate electrodes of the respective MOS transistors Qn2.

The two MOS transistors Qn1 and Qn2 have their respective drains connected together.

The MOS transistors Qn1 and Qn2 have their common drains connected to the gates of p-channel MOS transistors Qp1 and Qp2.

The MOS transistor Qp2 has its drain connected to its gate.

The MOS transistors Qp1 and Qp2 have their respective sources connected together to the drain of a p-channel MOS transistor Qp3, which has its source connected to a supply node of a supply voltage Vcc (for example, 3 volts).

Each pair of p-channel MOS transistors Qp1 and Qp2 constitutes one of p-type current mirrors CMP1 to CMP4. Each transistor Qp3 is intended for activation control of the corresponding current mirror.

A column address signal A0RB1 is applied to the gates of the transistors Qp3 that control the current mirrors CMP1 and CMP3. A column address signal A1RB1 is applied to the gates of the transistors Qp3 that control the current mirrors CMP2 and CMP4. The drains of the transistors Qp1 in the current mirrors CMP1 and CMP2 are connected together to an output node N1. The drains of the transistors Qp1 in the current mirrors CMP3 and CMP4 are connected together to an output node N3.

Each of the reference bit lines BLr0 and BLr1 is connected to a respective one of the sources of two n-channel MOS transistors Qn3, which have their gates connected to receive a control signal FIRR1 from the control signal/control voltage generator 16. The transistors Qn3 each have its drain connected to the gates of p-channel MOS transistors Qp4 and Qp5. The transistor Qp5 has its drain connected to its gate.

Each pair of transistors Qp4 and Qp5 has their sources connected together to the source of a p-channel MOS transistor Qp6, which has its source connected to a power supply node supplied with a supply voltage Vcc. That is, the pairs of the transistors Qp4 and Qp5 constitute p-channel current mirrors CMP5 and CMP6, respectively. Each of the transistors Qp6 is intended for activation control of a corresponding one of the current mirrors CMP5 and CMP6 and has its gate connected to receive a column address signal ARRB1.

The transistor Qp4 in the current mirror CMP5 has its drain connected to an output node N2, whereas the transistor Qp4 in the current mirror CMP6 has its drain connected to an output node N4.

The output node N1 is connected to the drain and gate of an n-channel MOS transistor Qn4, which has its source connected to ground node (0 V). The output node N2 is connected to the drain of an n-channel MOS transistor Qn5, which has its gate connected to the output node N1 and its source connected to the ground node.

The output node N3 is connected to the drain and gate of an n-channel MOS transistor Qn6, which has its source connected to the ground node. The output node N4 is connected to the drain of an n-channel MOS transistor Qn7, which has its gate connected to the output node N3 and its source connected to the ground node. That is, the transistors Qn4 and Qn5 constitute an n-channel current mirror CMn1, and the transistors Qn6 and Qn7 constitute an n-channel current mirror CMn2.

Furthermore, the source-drain paths of two p-channel MOS transistors Qp7 are connected between the output node N2 and the common gates of the transistors Qp4 and Qp5 in the current mirror CMP5 and between the output node N4 and the common gates of the transistors Qp4 and Qp5 in the current mirror CMP6, respectively.

The gates of the transistors Qp7 are supplied with a control signal ECRB1 from the control signal/control voltage generator 16. When data is read out, the transistor Qp7 is subjected to ON control in a predetermined interval.

One of the two sense circuits is composed of either of the p-channel current mirrors CMP1 and CMP2, the p-channel current mirror CMP5, and the n-channel current mirror CMn1.

The other of the two sense circuits is composed of either of the p-channel current mirrors CMP3 and CMP4, the p-channel current mirror CMP6, and the n-channel current mirror CMn2.

In the two sense circuits in the embodiment shown in FIG. 5, the n-channel current mirror CMn1 is made to correspond with the two p-channel current mirrors CMP1 and CMP2, and the n-channel current mirror CMn2 is made to correspond with the two p-channel current mirrors CMP3 and CMP4. This allows the circuit area to be reduced in comparison with the conventional circuit in which four n-channel current mirrors are provided.

In such a circuit arrangement, when the column address signal FIER1 goes high, the transistors Qn1 are turned ON, selecting the even-numbered bit lines BL (BL0-0, BL0-2, and so on). When the column address signal FIOR1 goes high, on the other hand, the transistors Qn2 are turned ON, selecting the odd-numbered bit lines BL (BL0-1, BL0-3, and so on).

The transistors Qp3 are subjected to on/off control by the column address signals A0RB1 and A1RB1. When each transistor Qp3 is turned ON, the corresponding current mirror CMPj (j=1, 2, 3 or 4) is activated, allowing the potential on a selected bit line BL to be detected.

The transistors Qp2 are intended to supply a current to selected corresponding bit lines BL. Each of the transistors Qp5 is intended to supply a current to the corresponding reference bit line BLr. Each of the transistors Qp7 is intended to short the corresponding reference bit line BLr to the corresponding output node N2 or N4.

The transistors Qn3, which correspond to the transistors Qn1 and Qn2, are intended to make the current supplied to the reference bit lines BLr equal to that to the bit lines BL. It is advisable that the transistors Qn1 and Qn2 each have sufficient current supplying capability as compared with the transistors Qp2 and the memory cells M. In FIG. 5, the transistors Qn3 can be omitted. The transistors Qp6 are activated when the control signal ARRB1 goes low, thus allowing the bit line potential detection.

When the memory cell array 1-2 is selected, the control signals FIRR1, FIER1 and FIOR1 remain low. Control signals FIRR2, FIER2 and FIOR2, which correspond to the signals FIRR1, FIER1, and FIOR1, respectively, are applied to the sense amplifier 17-2 to achieve the same control.

When the memory cell array 1-2 is selected, the control signals ECRB1, AORB1, A1RB1 and ARRB1 remain high. Control signals ECRB2, AORB2, A1RB2 and ARRB2 which correspond to the signals ECRB1, AORB1, A1RB1 and ARRB1, respectively, are applied to the sense amplifier 17-2 to achieve the same control.

In the example shown in FIG. 5, each transistor QP1 that receives at its gate a bit line potential is provided for every two bit lines; otherwise, it may be provided for each bit line. In that case, the transistors Qn1 and Qn2 will become unnecessary. In addition, one of the two reference bit lines BLr may be omitted. In that case, the number of bit lines that can be sensed at the same time is only reduced from two to one.

Figure 6:
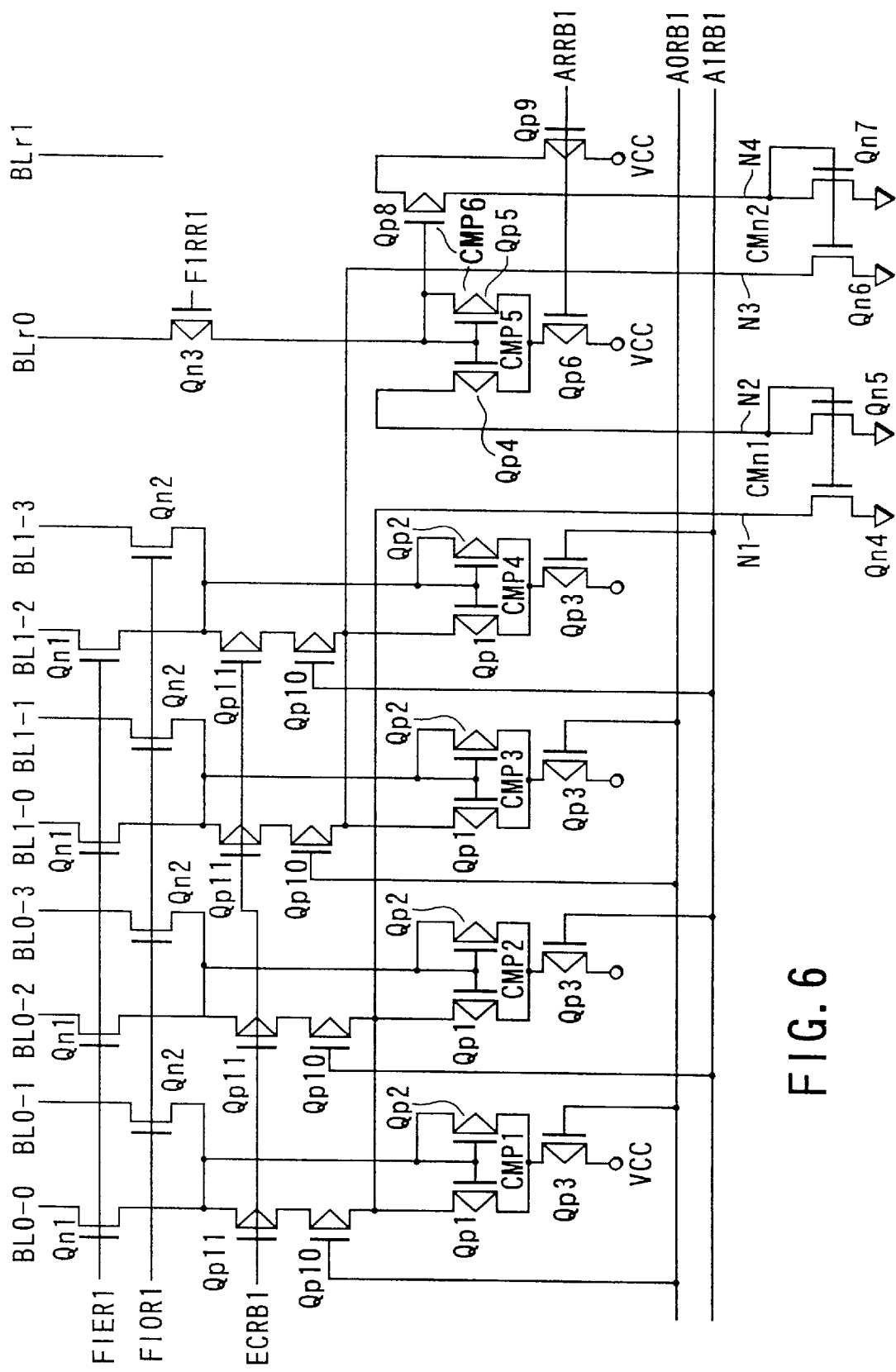
FIG. 6 shows the other circuit arrangement of the sense amplifiers of FIG. 2.

FIG. 6 shows another example of a circuit arrangement of the sense amplifier in the flash memory shown in FIG. 2. Although the circuit arrangement of the sense amplifier 17-1 is illustrated herein, the other sense amplifier 17-2 is arranged identically.

In this example, only one current mirror CMP5 is provided instead of providing the two current mirrors CMP5 and CMP6, and a p-channel MOS transistor Qp8 is provided in place of the current mirror CMP6. The gate of the transistor Qp8 is connected to the common gates of the transistors Qp4 and Qp5 in the current mirror CMP5. That is, it is the p-channel MOS transistor Qp8 that corresponds to the p-channel MOS transistor Qp4 in the current mirror CMP5. In this example, since only the reference bit line BLr0 is required, the reference bit line BLr1 is not connected to the sense circuit.

As in the case of the example of FIG. 5, multiple sense circuits (two in this example) are provided in order to detect potentials on multiple bit lines (two in this example) at the same time. Unlike the example of FIG. 5, in this example, the MOS transistor Qp5 supplies the reference bit line BLr0 with current. In this case, as the current mirror CMP5 is constituted by the transistors Qp4 and Qp5 and a current mirror CMP6 is constituted by the transistors Qp5 and Qp8, the transistor Qp5 shares the current mirror CMP 5 with the current mirror CMP6.

Moreover, it is a p-channel MOS transistor Qp9 that corresponds to the transistor Qp6 that activates the current mirror CMP5.

Furthermore, in this example, two p-channel MOS transistors Qp10 and Qp11 are connected in series between the drain of each transistor Qp1 and the common drains of the corresponding transistors Qn1 and Qn2.

Each transistor Qp10 has its gate connected to receive either of the column address signals A0RB1 and A1RB1, and each transistor Qp11 has its gate connected to receive the control signal ECRB1.

In the example of FIG. 6, unlike the example of FIG. 5, the transistors Qn4 and Qn5 have their respective gates connected together to the output node N2, and the transistors Qn6 and Qn7 have their respective gates connected together to the output node N4.

As in the example of FIG. 5, in the example of FIG. 6 as well, the even-numbered bit lines BL are selected by the transistors Qn1 as a result of the column address signal FIER1 going high, and the odd-numbered bit lines BL are selected by the transistors Qn2 as a result of the column address signal FIOR1 going high.

The corresponding transistors Qp3 and Qp10 are turned ON by the column address signal A0RB1 or A1RB1 to allow the potential on a selected corresponding bit line BL to be sensed.

Each transistor Qp2 is intended to supply a selected corresponding bit line BL with current. The transistor Qp5 is intended to supply the reference bit line BLr0 with current. Each series combination of the transistors Qp10 and Qp11 is intended to short a selected corresponding bit line BL to the node N1 or N3.

The transistor Qn3, corresponding to the transistor Qn1 or Qn2, is intended to match the currents on the bit lines and the reference bit line and has its gate controlled by the control signal F1RR1.

In this example as well, it is advisable that the transistors Qn1 and Qn2 have sufficient current supplying capability as compared with the transistors Qp2 and the memory cells M. In addition, the transistor Qn3 can be omitted to connect the reference bit line BLr0 to the current mirror CMP5. The transistor Qp6 is rendered conductive when the signal ARRB1 goes low, thereby activating the current mirror CMP5 to allow the bit line potential detection.

The control signals F1RR1, ECRB1 and ARRB1 are output signals of the control signal/control voltage generator 16. The control signals F1RR1, FIER1 and FIOR1 remain low when the memory cell array 1-2 is selected.

The control signals F1RR2, FIER2 and FIOR2 corresponding to the control signals F1RR1, FIER1 and FIOR1 are applied to the sense amplifier 17-2 to provide the same control.

The control signals ECRB1, AORB1, A1RB1 and ARRB1 remain high when the memory cell array 1-2 is selected. The control signals ECRB2, AORB2, A1RB2 and ARRB2 corresponding to The control signals ECRB1, AORB1, A1RB1 and ARRB1 are applied to the sense amplifier 17-2 to provide the same control.

In this example, each transistor Qp1 is provided for every two bit lines; otherwise it may be provided for each bit line. In that case, the transistors Qn1 and Qn2 become unnecessary.

Figure 7:
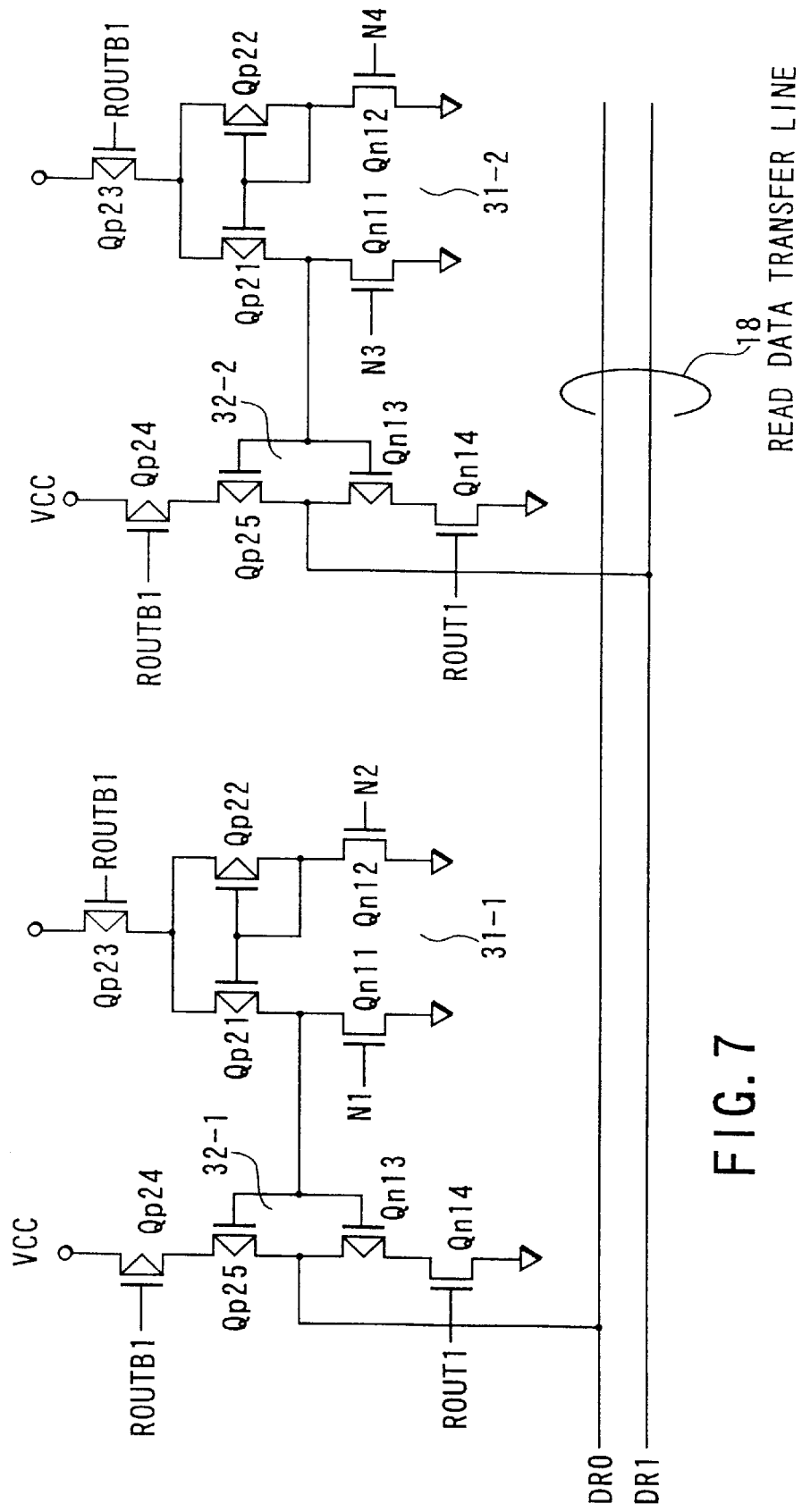
FIG. 7 shows a circuit arrangement of a portion added to the sense amplifiers shown in FIGS. 5 and 6.

FIG. 7 shows an arrangement of the remaining circuit portion of the sense amplifier 17-1 which is not shown in FIG. 5.

In the arrangement of FIG. 7, there are provided two amplifiers 31-1 and 31-2 each of which amplifies complementary outputs at the output nodes N1 and N2 or N3 and N4 of the two sense circuits to provide a bit of read data and two output circuits 32-1 and 32-2 each of which outputs the read data from a corresponding one of the amplifiers 31-1 and 31-2 onto the corresponding read data transfer line 18.

Each of the amplifiers 31-1 and 31-2, which are of the same arrangement, is a current mirror type differential amplifier that is composed of a differential pair of n-channel MOS transistors Qn11 and Qn12 having their respective gates connected to the output nodes N1 and N2 or N3 and N4, two p-channel MOS transistors Qp21 and Qp22 each serving as a load of a corresponding one of the differential pair of transistors Qn11 and Qn12, and an activation control p-channel MOS transistor Qp23 having its source-drain path connected between the common sources of the transistors Qp21 and Qp22 and the supply voltage Vcc and its gate connected to receive a control signal ROUTB1.

Each of the output circuits 32-1 and 32-2, which are of the same arrangement, is an inverter which is composed of two p-channel MOS transistors Qp24 and Qp25 having their source-drain paths connected in series between the supply voltage Vcc and the corresponding read data transistor line 18 and two n-channel MOS transistors Qn13 and Qn14 having their source-drain paths connected in series between ground and the corresponding read data transistor line 18. The gates of the transistors Qp25 and Qn13 are connected together to the drain of the transistor Qn11 in the corresponding amplifier.

When the memory cell array 1-1 is selected, the transistor Qp24 receives at its gate the control signal ROUTB1, the transistors Qp25 and Qn13 receive at their gates an output signal of the corresponding amplifier 31-1, and the transistor Qn14 receives at its gate the control signal ROUT1.

In this example, the read data transfer line 18 comprises two signal lines. Output data DR0 and DR1 of the respective output circuits 32-1 and 32-2 are outputted onto the read data transfer lines 18.

In such an arrangement, signal levels at the output nodes N1 and N2, N3 and N4 are further amplified by the amplifiers 31-1 and 31-2 and data DR0 and DR1 are outputted from the output circuits 32-1 and 32-2 onto the read data transfer lines 18.

The control signals ROUT1 and ROUTB1 are outputted from the control signal/control voltage generating circuit 16.

When the memory cell array 1-2 is selected, the control signals ROUT1 and ROUTB1 remain low and high, respectively. The control signals ROUT2 and ROUTB2 corresponding to the control signals ROUT1 and ROUTB1 are applied to the sense amplifier 17-2 to provide the same control.

The remaining circuit portions, i.e., the amplifiers and output circuits, of the sense amplifier 17-1 shown in FIG. 6 are arranged in the same manner as in FIG. 7. In the case of the sense amplifier 17-1 of FIG. 6, it is desirable that the output node N2 be connected to the gate of the transistor Qn11 and the output node N1 be connected to the gate of the transistor Qn12. Likewise, it is preferable that the output nodes N3 and N4 be connected to the gates of the transistors Qn12 and Qn11, respectively.

FIG. 8 shows a specific circuit arrangement of the bit line select circuits 2-1, 2-2 shown in FIG. 2. Here, the circuit arrangement of the bit line select circuit 2-1 associated with the sense amplifier 17-1 shown in FIG. 5 is illustrated.

The write data transfer line 5a comprises two signal lines over which a write voltage VD0 and a write voltage VD1 are transferred respectively.

There are provided two n-channel MOS transistors Qn15 and Qn16 for every two bit lines; BL0-0 and BL0-1, BL0-2 and BL0-3, BL1-0 and BL1-l, and BL1-2 and BL1-3. The two transistors Qn15 and Qn16 are connected at their sources or drains to the corresponding bit lines and connected together at their drains or sources. The transistor Qn15 receives at its gate the column address signal FIE1, while the transistor Qn16 receives at its gate the column address signal FIO1.

The source-drain path of an n-channel MOS transistor Qn17 is connected between each pair of transistors Qn15 and Qn16 and the write data transfer line 5a. More specifically, the two transistors Qn17 associated with the bit line pairs BL0-0 and BL0-1, and BL0-2 and BL0-3 are connected to the write data transfer line for the write voltage VD0. The two transistors Qn17 associated with the bit line pairs BL1-0 and BL1-1, and BL1-2 and BL1-3 are connected to the line for the write voltage VD1. The transistors Qn17 associated with the bit line pairs BL0-0 and BL0-1, and BL1-0 and BL1-1 are connected at their respective gates to receive a column address signal A0. The transistors Qn17 associated with the bit line pairs BL0-2 and BL0-3, and BL1-2 and BL1-3 are connected at their respective gates to receive a column address signal A1.

Two n-channel MOS transistors Qn18 are connected at their sources or drains to the two reference bit lines BLr0 and BLr1, respectively. The transistors Qn18 correspond to the transistors Qn15 and Qn16 on the memory cell side.

An n-channel MOS transistor Qn19 is connected between the corresponding transistor Qn18 and a line for transferring a write voltage VDR for a reference cell outputted from the control signal/control voltage generator 16. The transistor Qn19 is connected at its gate to receive a column address signal AR1 corresponding to the column address signals A0 and A1.

In such an arrangement, the control signals FIE1, FI01, FIR1 and AR1 remain low when the memory cell array 1-2 is selected. The control signals FIE2, FI02, FIR2 and AR2 corresponding to the control signals FIE1, FI01, FIR1 and AR1 are applied to the bit line select circuit 2-2 to provide the same control.

FIG. 9 shows a specific arrangement of the bit line select circuits 2-1, 2-2 shown in FIG. 2. Here, there is illustrated only the arrangement of the bit line select circuit 2-1 associated with the sense amplifier 17-1 shown in FIG. 6.

In the sense amplifier of FIG. 6, since the reference bit line BLr1 is not in use, it is not connected to the bit line select circuit. Thus, this bit line select circuit is the same as the bit line select circuit shown in FIG. 8 except that the transistors Qn18 and Qn19 associated with the reference bit line BLr1 are omitted.

Next, the operation of the flash memory arranged as described so far will be described.

First, reference will be made to a timing diagram of FIG. 10 to describe a read operation when the arrangements shown in FIGS. 5 and 7 are used for the sense amplifiers 17-1 and 17-2 and the arrangement of FIG. 8 is used for the bit line select circuits.

Here, the operation will be described in terms of memory cells in the memory cell array block 1-1.

At the read operation time, the voltages VD0, VD1 and VDR are set to a value that is a little less than the supply voltage Vcc (for example, 3 volts) minus the threshold Vthp (for example, 0.7 volts) of p-channel MOS transistors, ideally, the voltage on the reference bit line at the sense time, say, 2.0 volts.

The column address signals A0, FIE1 and FIER1 go high and AORB1 goes low to select the bit lines BL0-0 and BL1-0, which, in turn, are charged to VD0 and VD1, respectively (t1 to t2).

At the same time, the control signals AR1, FIR1 and FIRR1 goes high and ARRB1 goes low to select the reference bit line in the memory cell array 1-1, which, in turn, is charged to VDR (t1 to t2).

The control signal ECRB1 goes low to short the reference bit line BLr0 to the output node N2 and the reference bit line BLr1 to the output node N4 (t1 to t3). If, when the selected word line WL1 goes to Vcc, "0" is stored in a selected memory cell, then a read cell current will flow (t1 to t5). If, on the other hand, "1" is stored in the selected memory cell, then no read cell current will flow (t1 to t5).

The reference word line WLref is made equal in potential to a selected word line WL.

At time t2, the bit lines BL are cut off from the write voltage VD0 or VD1 and the reference bit lines BLr are cut off from the write voltage VDR, so that the selected bit line BL0-0, the reference bit line BLr0, the selected bit line BL1-0, and the reference bit line BLr1 are equalized by their associated sense amplifiers.

At time t3, the control signal ECRB1 goes high, so that the reference bit line BLr reaches a potential determined by on-resistances of the reference memory cell Mref and the transistor Q5.

At time t4, the control signals ROUT1 and ROUTB1 go high and low, respectively, so that the potential difference between the selected bit line BL and the reference bit line BLr is sensed. The sensed data is sent over the read data transfer line 18 to the data input/output buffer 7 and then outputted from the data input/output terminal 8.

During the time interval from t5 to t9, the bit lines BL0-3 and BL1-3 are selected and the word line WL2 is selected.

Here, the threshold of a memory cell M that stores "1" has been set to 1 volt by erasing. The threshold of a memory cell M that stores "0" has been set to 5 volts by writing. The threshold of the reference memory cell Mref is set between Vcc and the threshold of a memory cell M that stores "1".

If the ratio of the dimensions of the transistors Qp2 and Qp5 is set substantially equal to that of the transistors Qn1 (or Qn2) and Qn3, differences will be produced among currents in the order of the read cell current of a memory cell that stores "1", the current flowing in the reference memory cell Mref, and the read cell current of a memory cell that stores "0". As a result, differences are produced among potentials in the order of the potential on the bit line BL associated with a memory cell M that stores "1", the potential on the reference bit line, and the potential on the bit line BL associated with a memory cell M that stores "0".

If the difference between the potential on the bit line BL associated with a memory cell M that stores "1" and the potential on the reference bit line is insufficient, it is recommended that the transistor Qp5 A be made larger in channel width than the transistor Qp2.

If the difference between the potential on the bit line BL associated with a memory cell M that stores "0" and the potential on the reference bit line is insufficient, it is recommended that the transistor Qp5 be made smaller in channel width than the transistor Qp2. As an alternative, an adjustment may be made by producing a difference in potential between a selected word line WL and the reference word line WLref.

It is desirable that the transistors Qp1 and Qp4 be of the about same dimensions. Also, it is desirable that the transistors Qn4 and Qn5, Qn6 and Qn7 be of the same dimensions. The reason is that there are little variations in characteristics among transistors due to dimensional effects. However, in practice it is impossible to eliminate variations in characteristics among transistors.

In the present embodiment, therefore, the transistor Qp7 is provided for, when rendered conductive, virtually shorting the bit line BL to the reference bit line BLr through the sense amplifier. Thereby, the bit line BL and the reference bit line BLr are equalized so that variations in characteristics among transistors constituting the sense amplifier are absorbed.

For example, when the threshold of the transistor Qn5 becomes higher than that of the transistor Qn4, the current flowing through the transistor Qn5 becomes lower than the current flowing through the transistor Qn4. Thus, the reference bit line BLr becomes higher in potential than the bit line BL. Also, when the threshold of the transistor Qp4 becomes higher than that of the transistor Qp1, the current flowing through the transistor Qp4 becomes lower than the current flowing through the transistor Qp1. Therefore, the bit line BL becomes lower in potential than the reference bit line BLr.

The equalization can be performed fast by making the dimensions of the transistor Qp4 larger than those of the transistor Qp1 while keeping the ratio of the dimensions of the transistors Qp1 and Qp4 and the ratio of the dimensions of the transistors Qn4 and Qn5.

By charging the bit lines BL and the reference bit lines BLr to a predetermined potential in advance through the bit line select circuits 2-1 and 2-2 during the equalization, the time required for equalization and consequently the time required to read from memory cells are further reduced. Also, by raising a selected word line WL and the reference word line WLref simultaneously with equalization, the time required for equalization and consequently the time required to read from memory cells are further reduced.

Next, reference will be made to FIG. 11 to describe a read operation when the arrangements shown in FIGS. 5 and 6 are used for the sense amplifiers 17-1 and 17-2 and the arrangement of FIG. 9 is used for the bit line select circuits.

Figure 11:
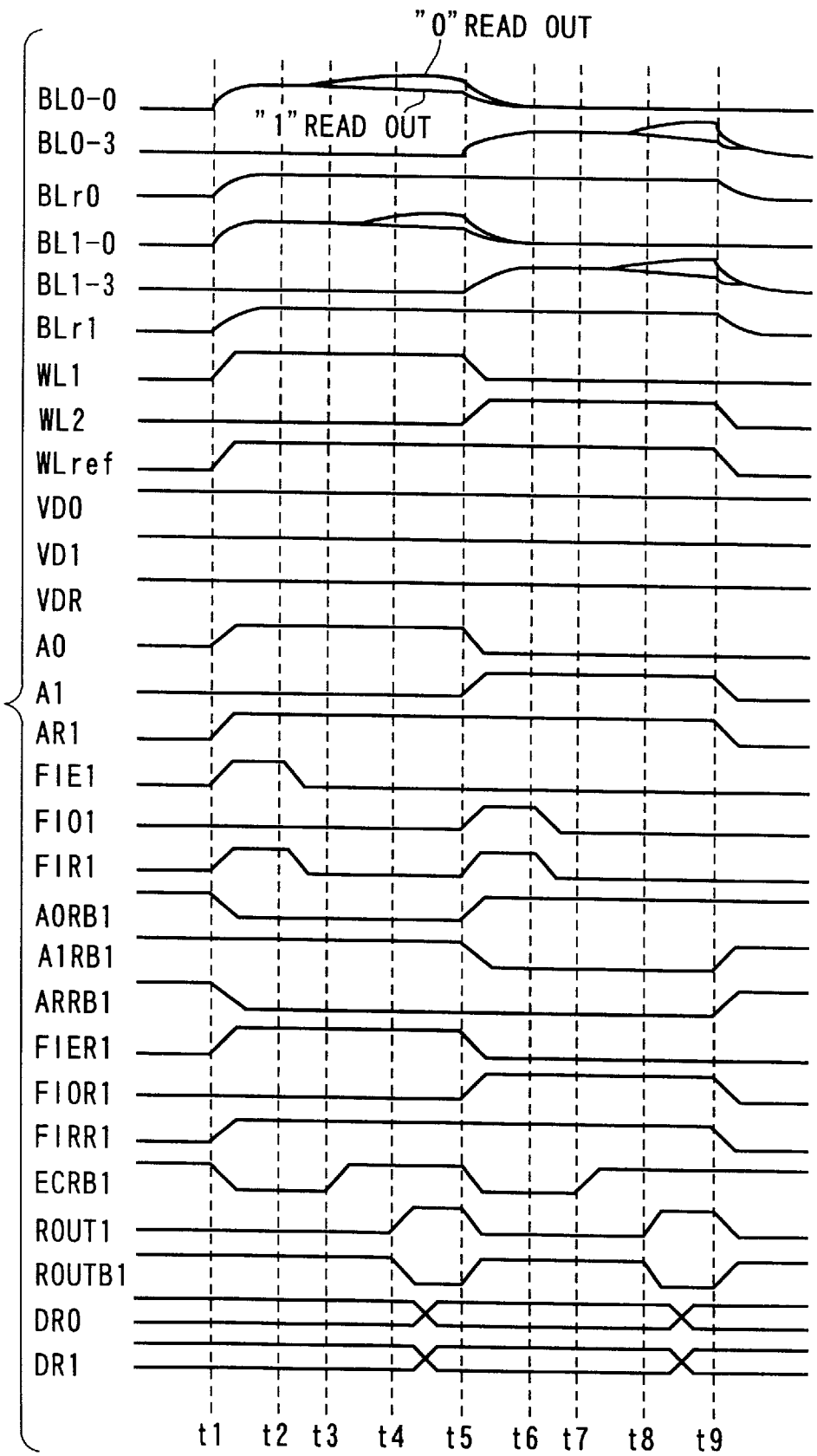
FIG. 11 is a timing diagram illustrating another example of a read operation of the flash memory of FIG. 2.

Here, the operation will be described as shown in FIG. 11 in terms of memory cells in the memory cell array block 1-1.

At the read operation, the voltages VD0, VD1, and VDR are set to a value that is a little less than the supply voltage Vcc (for example, 3 volts) minus the threshold Vthp (for example, 0.7 volts) of p-channel MOS transistors, ideally, the potential on the reference bit line at the sense time, say, 2.0 volts.

The column address signals A0, FIE1, and FIER1 go high and AORB1 goes low to select the bit lines BL0-0 and BL1-0, which, in turn, are charged to VD0 and VD1, respectively (t1 to t2).

At the same time, the control signals AR1, FIR1, and FIRR1 go high and ARRB1 goes low to select the reference bit line in the memory cell array 1-1, which, in turn, is charged to VDR (t1 to t3).

If, when the selected word line WL1 goes to Vcc, "0" has been stored in a selected memory cell, then a read cell current will flow (t1 to t5). If, on the other hand, "1" has been stored in the selected memory cell, then no read current will flow (t1 to t5).

At this point, the reference word line WLref is made equal in potential to a selected word line WL.

At time t2, the bit lines BL are cut off from the voltage VD0 or VD1 and the reference bit line BLr0 is cut off from the voltage VDR, so that the selected bit line BL0-0, the reference bit line BLr0, the selected bit line BL1-0, and the reference bit line BLr1 are equalized by their associated sense amplifiers.

At time t3, the signal ECRB1 goes high, so that the bit line BL reaches a potential determined by on-resistances of the memory cell M and the transistor Qp2.

At time t4, the signals ROUT1 and ROUTB1 go high and low, respectively, so that the potential difference between the selected bit line BL and the reference bit line BLr is sensed. The sensed data is sent over the read data transfer line 18 to the data input/output buffer 7 and then outputted from the data input/output terminal 8.

During the time interval from t5 to t9, the bit lines BL0-3 and BL1-3 are selected and the word line WL2 is selected.

Here, the threshold of a memory cell M that stores "1" has been set to 1 volt by erasing. The threshold of a memory cell M that stores "0" has been set to 5 volts by writing. The threshold of the reference memory cell Mref has been set to a value between Vcc and the threshold of memory cells M that store "1".

If the ratio of the dimensions of the transistors Qp2 and Qp5 is set equal to that of the transistors,Qn1 (or Qn2) and Qn3, then differences will be produced among currents in the order of the read cell current of a memory cell that stores "1", the current flowing in the reference memory cell Mref, and the read cell current of a memory cell that stores "0". As a result, differences are produced among potentials in the order of the potential on the bit line BL associated with a memory cell that stores "1", the potential on the reference bit line, and the potential on the bit line BL associated with a memory cell M that stores "0".

If the difference between the potential on the bit line BL associated with a memory cell that stores "1" and the potential on the reference bit line is insufficient, it is recommended that the transistor Qp5 be made larger in channel width than the transistor Qp2.

If the difference between the potential on the bit line BL associated with a memory cell that stores "0" and the potential on the reference bit line is insufficient, it is recommended that the transistor Qp5 be made smaller in channel width than the transistor Qp2. Alternatively, an adjustment may be made by producing a difference in potential between a selected word line WL and the reference word line Wref.

It is desirable that the transistors Qp1 and Qp4 be of the same dimensions. Also, it is desirable that the transistors Qn4 and Qn5 be of the same dimensions. The reason is that there are little variations in characteristics among transistors due to dimensional effects. However, in practice it is impossible to eliminate variations in characteristics among transistors.

In the present embodiment, therefore, the transistors Qp10 and Qp11 are provided for, when rendered conductive, virtually shorting the bit line BL to the reference bit line BLr via the sense amplifier. Thereby, the bit line BL and the reference bit line BLr are equalized so that variations in characteristics among transistors constituting the sense amplifier are absorbed.

For example, when the threshold of the transistor Qn4 becomes higher that of the transistor Qn5, the current flowing through the transistor Qn4 becomes lower than the current flowing through the transistor Qn5. Thus, the bit line BL becomes higher in potential than the reference bit line BLr. Also, when the threshold of the transistor Qp1 becomes higher that of the transistor Qp4, the current flowing through the transistor Qp1 becomes lower than the current flowing through the transistor Qp4. Therefore, the bit line BL becomes lower in potential than the reference bit line BLr.

The equalization can be performed fast by making the dimensions of the transistor Qp1 larger than those of the transistor Qp4 while keeping the ratio of the dimensions of the transistors Qp1 and Qp4 and the ratio of the dimensions of the transistors Qn4 and Qn5.

By charging the bit lines BL and the reference bit lines BLr to a predetermined potential in advance through the bit line select circuits 2-1 and 2-2 during the equalizing time, the time required for equalization and consequently the time required to read from memory cells are further reduced. Also, by raising a selected word line WL and the reference word line WLref simultaneously with equalization, the time required for equalization and consequently the time required to read from memory cells are further reduced.

Figure 10:
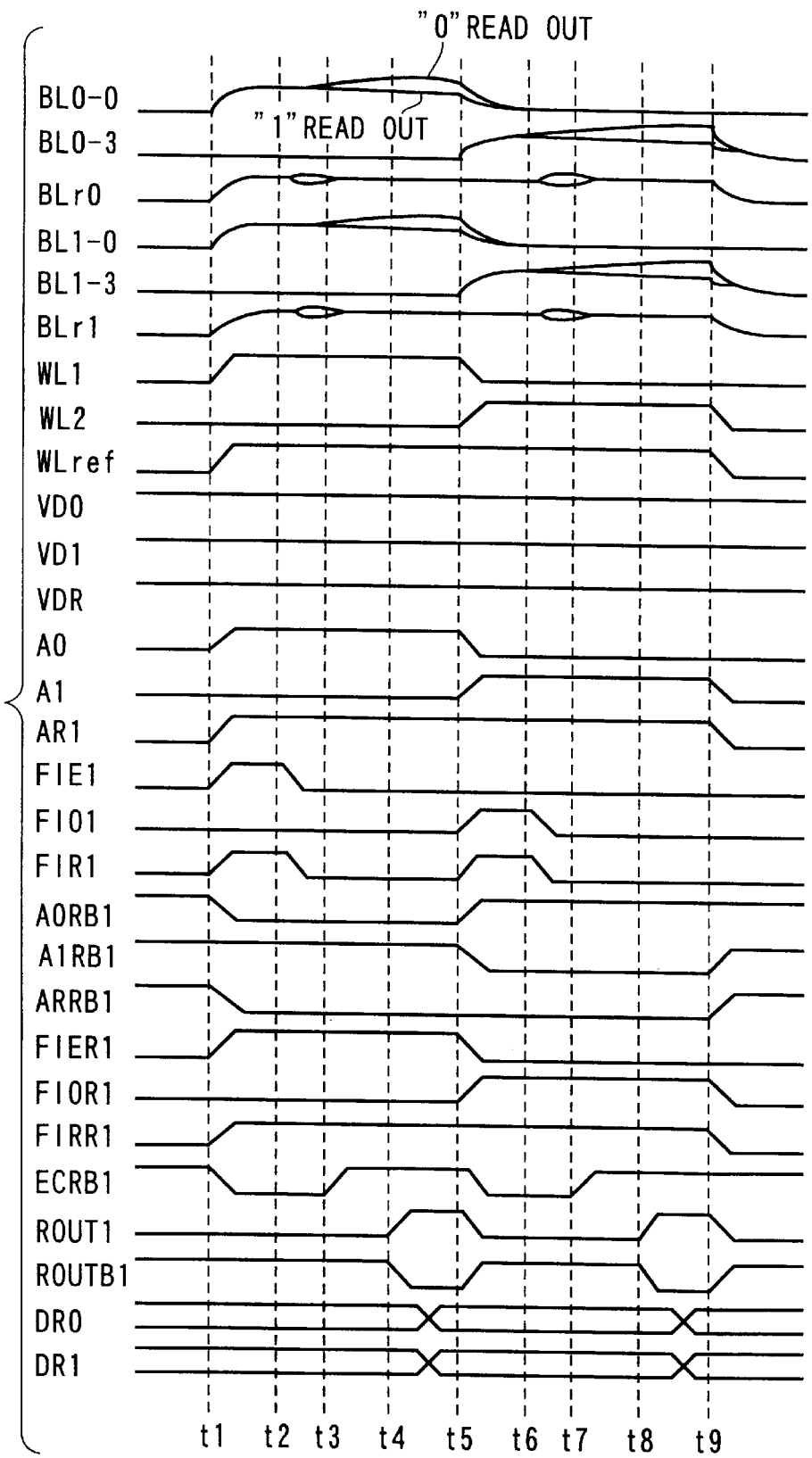
FIG. 10 is a timing diagram illustrating an example of a read operation of the flash memory of FIG. 2.
Figure 12:
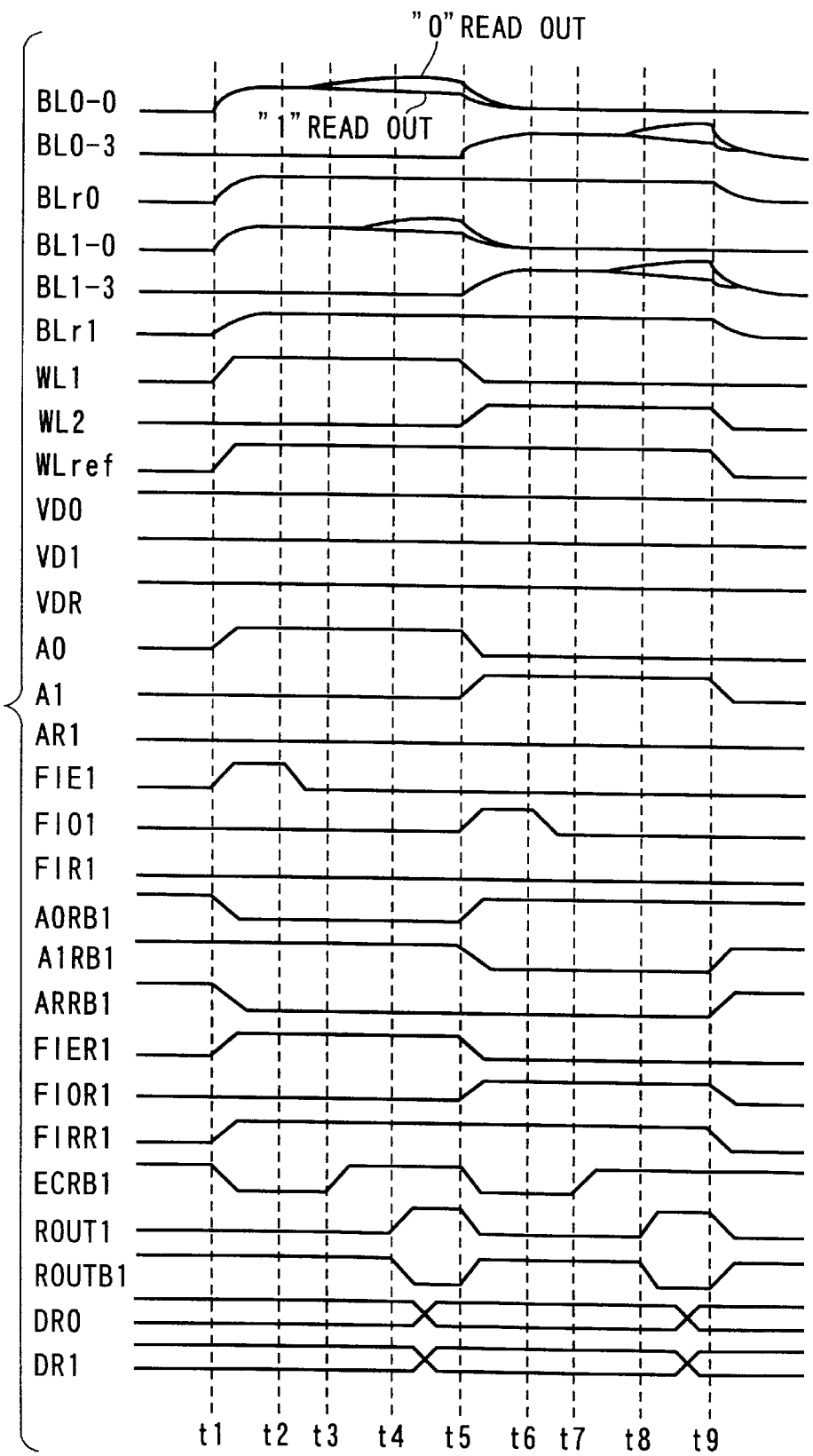
FIG. 12 is a timing diagram illustrating still another example of a read operation of the flash memory of FIG. 2.

FIG. 12 shows a modification of the read operation illustrated in FIG. 10. Unlike FIG. 10, in FIG. 12, the address signals AR1 and FIR1 are made low all the time. If the bit lines BL and the reference bit lines BLr can be equalized sufficiently fast by rendering the transistor Qp7 conductive, the need to charge the reference bit lines BLr to VDR is eliminated. In such a case, keeping the AR1 and FIR1 low will result in less power dissipation.

Though not shown, the address signals A0, A1, FIE1 and FIO1 may be made low all the time. If the bit lines BL can be equalized sufficiently fast by rendering the transistor Qp2 conductive, the need to charge the reference bit lines BLr to VD0 or VD1 is eliminated. In such a case, keeping the A0, A1, FIE1 and FIO1 low will result in less power dissipation.

Figure 13:
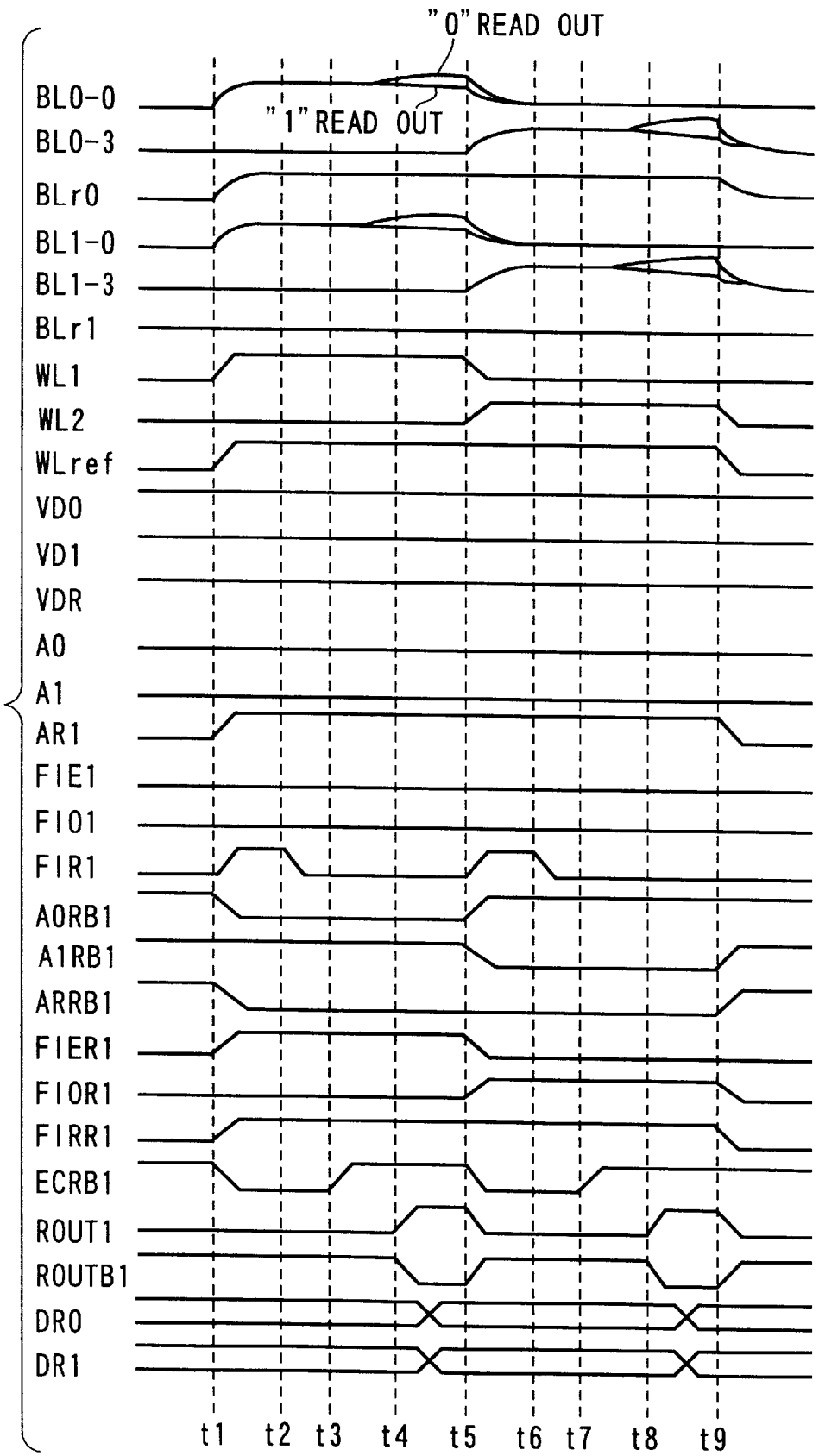
FIG. 13 is a timing diagram illustrating a further example of a read operation of the flash memory of FIG. 2.

FIG. 13 shows a modification of the read operation illustrated in FIG. 11. Unlike FIG. 11, in FIG. 13, the address signals A0, A1, FIE1 and FIO1 are all made low all the time.

If the bit lines BL and the reference bit line BLr can be equalized sufficiently fast by the transistors Qp10 and Qp11, the need to charge the reference bit lines BLr to VD0 or VD1 is eliminated. In such a case, keeping the address signals A0, A1, FIE1 and FIO1 low will result in less power dissipation.

Though not shown, the address signals AR1 and FIR1 may be made low all the time. If the reference bit line BLr can be equalized sufficiently fast by the transistor Qp5, the need to charge the reference bit lines BLr to VDR is eliminated. In such a case, keeping the AR1 and FIR1 low will result in less power dissipation.

Figure 14:
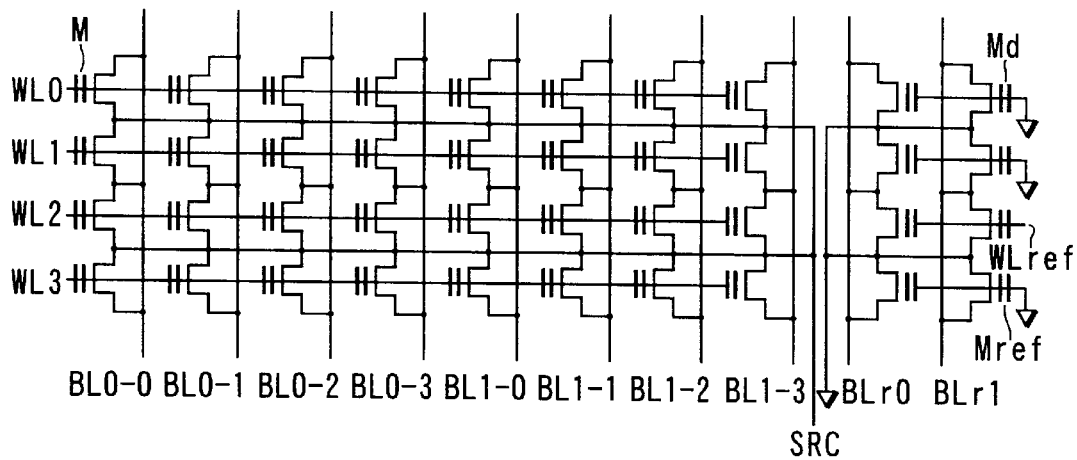
FIG. 14 shows another circuit arrangement of the memory cell arrays in the flash memory of FIG. 2.

FIG. 14 shows a modification of the memory cell array blocks shown in FIG. 3. The arrangement of the memory cell array 1-1 is illustrated herein. The difference from the arrangement of FIG. 3 is that the number of contacts between the reference bit lines BLr and the dummy memory cells Md is reduced. In other words, the static capacitances associated with the reference bit lines BLr are made smaller than those of the bit lines BL.

Since the dummy memory cell Md has such a sectional structure as shown in FIG. 4, a stray capacitance is present between the n-type diffusion 21 and the p-type substrate 20 or between the n-type diffusion 21 and the control gate 25. If, therefore, the reference bit lines BLr are isolated from the dummy memory cells Md, their associated capacitances will be reduced. This will increase the speed of charging the reference bit lines BLr through the transistors Qp7 and Qn3 or Qp5 and Qn3, or the bit line select circuit 2-1. Therefore, an increase in the speed of reading from memory cells and a further reduction in power dissipation can be achieved.

Figure 15:
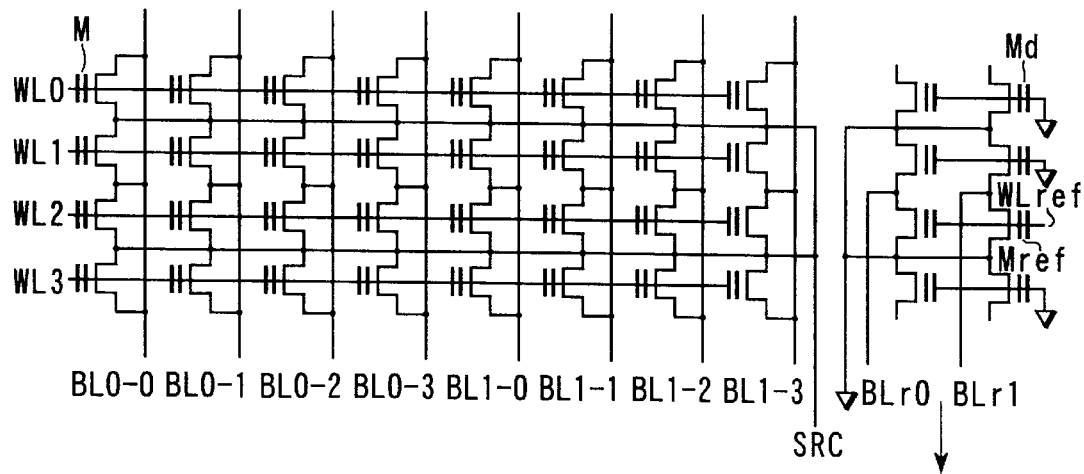
FIG. 15 shows still another circuit arrangement of the memory cell arrays in the flash memory of FIG. 2.

FIG. 15 shows a further modification of the memory cell array blocks shown in FIG. 3. The arrangement of the memory cell array block 1-1 is illustrated herein. The difference from the arrangement of FIG. 3 is that the number of contacts between the reference bit lines BLr and the dummy memory cells Md is reduced. In other words, the static capacitances associated with the reference bit lines BLr are made smaller than those of the bit lines BL.

To reduce the capacitance more than in the arrangement of FIG. 14, the length of the reference bit lines BLr is reduced. The reference bit lines BLr are extended from the sense amplifier 17 only to the reference memory cells Mref. Since the dummy memory cells have such a sectional structure as shown in FIG. 4, a parasitic capacitance is present between the n-type diffusion 21 and the p-type substrate 20 or between the n-type diffusion 21 and the control gate 25.

In addition, a parasitic capacitance is also associated with an adjacent bit line BL or reference bit line BLr. By placing the reference bit lines apart from the dummy memory cells Md and shortening the reference bit line, the capacitances associated with the reference bit line is further reduced, which further increases the speed of charging the reference bit lines BLr through the transistors Qp7 and Qn3 or Qp5 and Qn3, or the bit line select circuit 2-1 (2-2). Therefore, an increase in the speed of reading from memory cells and a further reduction in power dissipation can be achieved.

When the memory cell array of FIG. 15 is used, the charging may become impossible, depending on the arrangement of the bit line select circuit. When the charging is needed, it is required only that the bit line select circuit 2-1 (2-2) and the sense amplifier 17-1 (17-2) be placed along the same side of the memory cell array.

As described so far, the semiconductor device of the present invention is arranged to suppress parasitic capacitances associated with bit lines by placing a plurality of sense amplifiers in the neighborhood of the bit lines, thereby achieving an improvement in the speed of reading data from memory cells. In addition, the circuit area can be reduced by allowing a circuit portion to be shared by the sense amplifiers. Moreover, by equalizing sense nodes and reference nodes through the sense amplifiers, variations among transistors constituting the sense amplifiers can be compensated for. Furthermore, by applying a read voltage to a word line simultaneously with the equalization, the time taken for the word line to reach the read voltage can be made invisible. Thus, a semiconductor memory device can be implemented which allows fast data readout.

The present invention is not limited to the embodiment described above. For example, although the present invention was described in terms of an implementation of a flash memory, the invention can be implemented as any other semiconductor memory device, such as a ROM, a PROM, an EPROM, an EEPROM, an SRAM, or the like. Although, in the bit line potential sense circuit, the p-channel MOS transistors Qp1 and Qp2 are used to receive inputs, the circuit may be modified such that n-channel MOS transistors receive the inputs.

The present invention may be practiced or embodied in still other ways without departing the scope and spirit thereof.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor memory device comprising:

a memory cell transistor;

a bit line connected to one end of the memory cell transistor;

a word line connected to a gate of the memory cell transistor;

a reference cell transistor;

a reference bit line connected to one end of the reference cell transistor;

a reference word line connected to a gate of the reference cell transistor;

a sense circuit for sensing data stored in the memory cell transistor, the sense circuit including a first MIS transistor of a first conductivity type having a first terminal connected to a first sense output node, a second terminal electrically connected to a first potential, and a gate coupled to the one end of the memory cell transistor, a second MIS transistor of the first conductivity type having a first terminal connected to a second sense output node, a second terminal electrically connected to the first potential, and a gate coupled to the one end of the reference cell transistor, a third MIS transistor of a second conductivity type having a first terminal connected to the first sense output node, a second terminal electrically connected to a second potential, and a gate coupled to the first sense output node, a fourth MIS transistor of the second conductivity type having a first terminal connected to the second sense output node, a second terminal electrically connected to the second potential, and a gate connected to the first sense output node, and a fifth MIS transistor of the first conductivity type connected between the second sense output node and the gate of the second MIS transistor; and a data readout control circuit for controlling the fifth MIS transistor to conduct for a predetermined interval of time.

2. The semiconductor memory device according to claim 1, wherein the memory cell transistor is a nonvolatile transistor having a charge storage layer.

3. The semiconductor memory device according to claim 1, wherein the reference cell transistor is a nonvolatile transistor having a charge storage layer.

4. The semiconductor memory according to claim 1, wherein the sense circuit further includes
a sixth MIS transistor of the first conductivity type having a first terminal and gate connected together to the gate of the first MIS transistor and a second terminal electrically connected to the first potential, and
a seventh MIS transistor of the first conductivity type having a first terminal and gate connected together to the gate of the second MIS transistor and a second terminal electrically connected to the first potential.

5. The semiconductor memory device according to claim 1, wherein the reference bit line is smaller in static capacitance than the bit line.

6. The semiconductor memory device according to claim 1, wherein, in a read operation, the data readout control circuit renders the fifth MIS transistor conductive and applies a read voltage to the word line.

7. The semiconductor memory device according to claim 1, wherein, in a read operation, the data readout control circuit renders the fifth MIS transistor conductive and applies a read voltage to the reference word line.

8. A semiconductor memory device comprising:
a memory cell transistor;
a bit line connected to one end of the memory cell transistor;
a word line connected to a gate of the memory cell transistor;
a reference cell transistor;
a reference bit line connected to one end of the reference cell transistor;
a reference word line connected to a gate of the reference cell transistor;
a sense circuit for sensing data stored in the memory cell transistor, the sense circuit including
a first MIS transistor of a first conductivity type having a first terminal connected to a first sense output node, a second terminal electrically connected to a first potential, and a gate coupled to the one end of the memory cell transistor,
a second MIS transistor of the first conductivity type having a first terminal connected to a second sense output node, a second terminal electrically connected to the first potential, and a gate coupled to the one end of the reference cell transistor,
a third MIS transistor of a second conductivity type having a first terminal connected to the first sense output node, a second terminal electrically connected to a second potential, and a gate coupled to the second sense output node, a fourth MIS transistor of the second conductivity type having a first terminal connected to the second sense output node, a second terminal electrically connected to the second sense output node, and a gate connected to the second sense output node, and a fifth MIS transistor of the first conductivity type electrically connected between the first sense output node and the gate of the first MIS transistor; and a data readout control circuit for controlling the fifth MIS transistor to conduct for a predetermined interval of time.

9. The semiconductor memory device according to claim 8, wherein the memory cell transistor is a non-volatile transistor having a charge storage layer.

10. The semiconductor memory device according to claim 8, wherein the reference cell transistor is a non-volatile transistor having a charge storage layer.

11. The semiconductor memory device according to claim 8, wherein the sense circuit further includes
a sixth MIS transistor of the first conductivity type having a first terminal and gate connected together to the gate of the first MIS transistor and a second terminal electrically connected to the first potential, and
a seventh MIS transistor of the first conductivity type having a first terminal and gate connected together to the gate of the second MIS transistor and a second terminal electrically connected to the first potential.

12. The semiconductor memory device according to claim 8, wherein the reference bit line is smaller in static capacitance than the bit line.

13. The semiconductor memory device according to claim 8, wherein, in a read operation, the data readout control circuit renders the fifth MIS transistor conductive and applies a read voltage to the word line.

14. The semiconductor memory device according to claim 8, wherein, in a read operation, the data readout control circuit renders the first MIS transistor conductive and applies a read voltage to the reference word line.

15. A semiconductor memory device comprising:
a memory cell array having memory cells;
a reference memory cell;
a sense amplifier placed adjacent to the memory cell array for sensing data stored in the memory cells, the sense amplifier having
a first current mirror circuit of a first conductivity type connected to a supply node of a first signal to supply the first signal corresponding to stored data in the memory cells,
a second current mirror circuit of the first conductivity type connected to a supply node of a second signal to supply the second signal corresponding to stored data in the reference memory cell,
a third current mirror circuit of a second conductivity type responsive to outputs of the first and second current mirror circuits for outputting complementary data, and
an equalizer for mirroring, through the third current mirror circuit, a first current flowing through one of the supply nodes to a second current flowing through another of the supply nodes;
a data writing control circuit for controlling writing into the memory cells; and
a data input/output circuit for outputting data sensed by the sense amplifier and supplying externally applied data to the data writing control circuit.

16. The semiconductor memory device according to claim 15, wherein the third current mirror circuit is provided commonly for a plurality of first current mirror circuits.

17. A semiconductor memory device according to claim 15, wherein said first current mirror circuit includes a first MIS transistor of the first conductivity type having a first terminal connected to the supply node of the first signal, a second terminal electrically connected to a first potential, and a gate connected to one end of each of the memory cells and a second MIS transistor of the first conductivity type having a first terminal and gate commonly connected to the gate of the first MIS transistor, and a second terminal electrically a connected to the first potential, said second current mirror circuit includes a third MIS transistor of the first conductivity type having a first terminal connected to the supply node of the second signal, a second terminal electrically connected to the first potential, and a gate connected to one end of the reference memory cell and a fourth MIS transistor of the first conductivity type having a first terminal and gate commonly connected to the gate of the third MIS transistor, and a second terminal electrically connected to the first potential, and said third current mirror circuit includes a fifth MIS transistor of the second conductivity type having a first terminal connected to a supply node of the first signal, a second terminal electrically connected to a second potential, and a gate connected to the supply node of the first signal, and a sixth MIS transistor of the second conductivity type having a first terminal connected to the supply node of the second signal, a second terminal electrically connected to the second potential, and a gate connected to the supply node of the first signal.

18. A semiconductor memory device according to claim 17, wherein said equalizer is comprised of a seventh transistor of the first conductivity type connected between the supply node of the second signal and the gate of the third MIS transistor.

19. A semiconductor memory device according to claim 15, wherein said first current mirror circuit includes a first MIS transistor of the first conductivity type having a first terminal connected to the supply node of the first signal, a second terminal electrically connected to a first potential, and a gate connected to one end of each of the memory cells and a second MIS transistor of the first conductivity type having a first terminal and gate commonly connected to the gate of the first MIS transistor, and a second terminal electrically connected to the first potential, said second current mirror circuit includes a third MIS transistor of the first conductivity type having a first terminal connected to the supply node of the second signal, a second terminal electrically connected to the first potential, and a gate connected to one end of the reference memory cell and a fourth MIS transistor of the first conductivity type having a first terminal and gate commonly connected to the gate of the third MIS transistor, and a second terminal electrically connected to the first potential, and said third current mirror circuit includes a fifth MIS transistor of the second conductivity type having a first terminal connected to the supply node of the first signal, a second terminal electrically connected to a second potential, and a gate connected to the supply node of the second signal, and a sixth MIS transistor of the second conductivity type having a first terminal connected to the supply node of the second signal, a second terminal electrically connected to the second potential, and a gate connected to the supply node of the second signal.

20. A semiconductor memory device according to claim 19, wherein said equalizer is comprised of a seventh transistor of the first conductivity type connected between the supply node of the first signal and the gate of the first MIS transistor.

* * * * *